United States Patent [19]

Barre

[11] Patent Number: 5,397,932
[45] Date of Patent: Mar. 14, 1995

[54] SWITCHING STAGE

[75] Inventor: Claude Barre, Lyons, France

[73] Assignee: Siemens Aktiengesellschaft, Munich, Germany

[21] Appl. No.: 88,153

[22] Filed: Jul. 6, 1993

[30] Foreign Application Priority Data

Jul. 6, 1992 [DE] Germany .................. 42 22 170.6

[51] Int. Cl.[6] ............................................ H03K 17/60
[52] U.S. Cl. .................................... 327/108; 327/482; 327/65
[58] Field of Search ................ 307/254, 261, 263, 475, 307/494, 542, 546, 547, 549, 572, 270

[56] References Cited

U.S. PATENT DOCUMENTS

| 3,535,546 | 10/1970 | Davis | 307/471 |
| 3,702,944 | 11/1972 | Shigaki | 307/246 |
| 4,205,273 | 5/1980 | Yoshida | 330/251 |
| 4,868,421 | 9/1989 | Herndon et al. | 307/446 |
| 4,896,333 | 1/1990 | Can | 307/261 |
| 5,059,829 | 10/1991 | Flannagan et al. | 307/475 |
| 5,159,213 | 10/1992 | Johnson | 307/549 |
| 5,216,296 | 6/1993 | Tsunoi et al. | 307/263 |
| 5,223,753 | 6/1993 | Lee et al. | 307/494 |

FOREIGN PATENT DOCUMENTS

| 0294163 | 12/1988 | European Pat. Off. . |
| 2903513 | 8/1979 | Germany . |
| 3140187 | 4/1983 | Germany . |
| 62-281616 | 5/1988 | Japan . |
| 2104126 | 4/1990 | Japan . |

Primary Examiner—Steven L. Stephan
Assistant Examiner—Shawn Riley
Attorney, Agent, or Firm—Herbert L. Lerner; Laurence A. Greenberg

[57] ABSTRACT

A switching stage includes a differential amplifier configuration. An emitter follower transistor is connected downstream of the differential amplifier configuration. A terminal is provided for a first supply potential. A terminal for a second supply potential is connected to the collector of the emitter follower transistor. A controllable current source is connected between the emitter of the emitter follower transistor and the terminal for the first supply potential. The current source has a control input. A resistor has a first terminal connected to the emitter of the emitter follower transistor and a second terminal connected to a switching stage output. A circuit having a signal output is connected to the first and second terminals of the resistor and to the terminal for the first supply potential, for supplying a signal at the signal output being dependent on the polarity of a voltage dropping at the resistor. The control input of the current source is connected to the signal output of the signal supplying circuit for controlling the current source to cause a high current to flow when the first terminal of the resistor is at a more negative potential than the second terminal of the resistor and to cause a low current to flow when the first terminal of the resistor is at a more positive potential than the second terminal of the resistor.

4 Claims, 1 Drawing Sheet

SWITCHING STAGE

BACKGROUND OF THE INVENTION

FIELD OF THE INVENTION

The invention relates to a switching stage having a differential amplifier configuration; an emitter follower transistor connected downstream thereof; a current source connected between the emitter of the emitter follower transistor and a terminal for a first supply potential; an output; a resistor with a first terminal connected to the emitter of the emitter follower transistor and a second terminal connected to the output; and a terminal for a second supply potential being connected to the collector of the emitter follower transistor.

Such switching stages are used, for instance, as output drivers in integrated circuits made by the current switch technique. The output of the switching stage is connected to one end of a signal line that is disposed on a printed wiring board. The other end of the signal line is connected to the base of an input transistor of a further switching stage. Upon a changeover, a current flows through the resistor, and due to this current the capacitors of the signal line are inversely charged. At the transition from a low level to a high level, the current flows through the resistor from the emitter of the emitter follower transistor to the output of the switching stage. At the transition from a high to a low level, the current flows in the opposite direction. In the first instance, the current is furnished by the emitter follower transistor, which additionally carries the current impressed by the current source. In the second instance, the current flows through the resistor through the current source. Since the current source continuously furnishes the current impressed by it, in other words during the state of repose of the switching stage as well, the power loss is high.

SUMMARY OF THE INVENTION

It is accordingly an object of the invention to provide a switching stage, which overcomes the hereinaforementioned disadvantages of the heretofore-known devices of this general type and which does so in such a way that the power loss is low.

With the foregoing and other objects in view there is provided, in accordance with the invention, a switching stage, comprising a differential amplifier configuration; an emitter follower transistor having a base connected downstream of the differential amplifier configuration, having an emitter and having a collector; a terminal for a first supply potential; a terminal for a second supply potential being connected to the collector of the emitter follower transistor; a controllable current source being connected between the emitter of the emitter follower transistor and the terminal for the first supply potential, the current source having a control input; a switching stage output; a resistor having a first terminal connected to the emitter of the emitter follower transistor and a second terminal connected to the switching stage output; means having a signal output and being connected to the first and second terminals of the resistor and to the terminal for the first supply potential, for supplying a signal at the signal output being dependent on the polarity of a voltage dropping at the resistor; the control input of the current source being connected to the signal output of the signal supplying means for controlling the current source to cause a high current to flow when the first terminal of the resistor is at a more negative potential than the second terminal of the resistor and to cause a low current to flow when the first terminal of the resistor is at a more positive potential than the second terminal of the resistor.

In accordance with another feature of the invention, the controllable current source includes a resistor and a bipolar transistor having an emitter, a collector and a base, the collector of the bipolar transistor is connected to the emitter of the emitter follower transistor, the emitter of the bipolar transistor is connected through the resistor to the terminal for the first supply potential and the base of the bipolar transistor forms the control input of the current source.

In accordance with a further feature of the invention, the resistor is a first resistor; the signal supplying means have first and second bipolar transistors with emitters, collectors and bases, first and second diodes with anodes and cathodes, and second and third resistors; the anode of the first diode is connected to the first terminal of the first resistor, and the cathode of the second diode is connected to the terminal for the first supply potential; the second resistor is connected between the cathode of the first diode and the anode of the second diode; the base of the first bipolar transistor is connected to the second terminal of the first resistor, and the emitter of the second bipolar transistor is connected to the terminal for the first supply potential; the third resistor is connected between the emitter of the first bipolar transistor and the collector of the second bipolar transistor; the base of the second bipolar transistor is connected to the anode of the second diode; the collector of the first bipolar transistor is connected to the first terminal of the first resistor; and the collector of the second bipolar transistor forms the signal output of the signal supplying means.

In accordance with a concomitant feature of the invention, the emitter follower transistor has a collector-to-emitter path being connected between the collector of the first bipolar transistor and the first terminal of the first resistor.

Other features which are considered as characteristic for the invention are set forth in the appended claims.

Although the invention is illustrated and described herein as embodied in a switching stage, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 2:
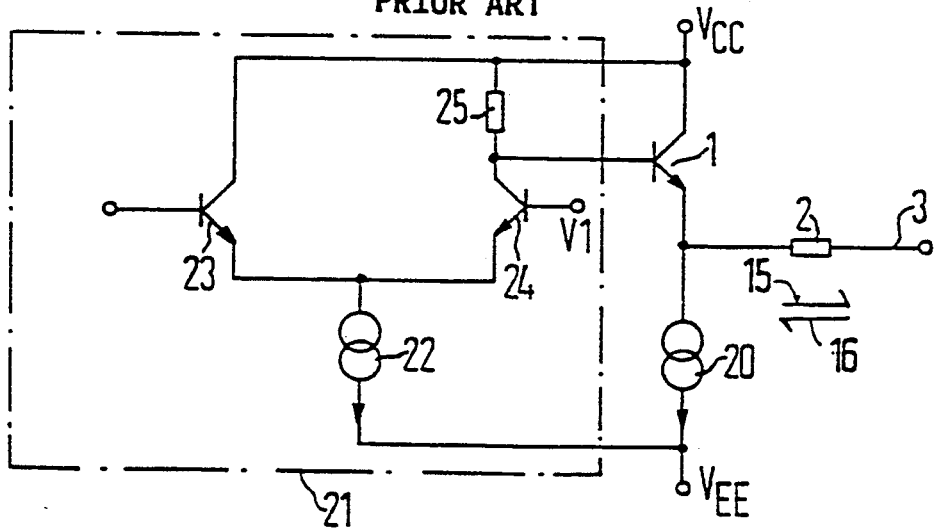
FIG. 2 is a schematic circuit diagram of a switching stage of the prior art.

Referring now to the figures of the drawing in detail and first, particularly, to FIG. 2 thereof, there is seen a known switching stage which includes a differential amplifier configuration 21 operating as a current switch, with an output driver stage following it. The differential amplifier configuration 21 includes two emitter-coupled bipolar transistors 23, 24. The emitters of the bipolar transistors 23, 24 are connected through a current source 22 to a terminal for a first supply potential $V_{EE}$. The collector of the bipolar transistor 23 is connected directly, and the collector of the bipolar transistor 24 is connected through a resistor 25, to a terminal for a further supply potential $V_{CC}$. The base of the transistor 23 is controlled by an input signal and the base of the bipolar transistor 24 is connected to a terminal for a reference potential V1. The collector of the bipolar transistor 24 serves as the output of the current switch. The collector of the bipolar transistor 24 is followed by an emitter follower transistor 1, having a collector which is connected through the terminal for the supply potential $V_{CC}$ and having an emitter which is connected through a current source 20 to the terminal for the supply potential $V_{EE}$. The emitter of the emitter follower transistor 1 is also connected through a resistor 2 to an output 3 of the switching stage. The output 3 serves as a terminal for a conductor track on a printed wiring board. The other end of the conductor track is typically connected to the base of an input transistor of a further switching stage. In the state of repose of the switching stage, the base current of the input transistor of the further switching stage flows through the resistor 2. Upon a switchover from a low level to a high level or from a high level to a low level, the potential at the emitter of the emitter follower transistor 1 shifts by the signal level rise dropping at the resistor 25. The resistor 2 is dimensioned in such a way that it corresponds to the wave resistance of the line connected to the output. The other end of the line therefore acts as an open circuit. During the switchover from L to H or from H to L, a relatively high current, with which the line capacitors are inversely charged, flows through the resistor 2. The base current of the following input transistor is negligible in comparison with this current. Since the resistor 2 has the value of the wave resistance of the line, the level present at the output rises or falls initially by only half the level rise. The wave spreading along the line is reflected at the other end acting as an open circuit. It is then superimposed on the level already present at the output 3. Thus the H or L level at the output 3 does not result until the back and forth time of the wave along the line has elapsed. During this time, the current flows through the resistor 2.

In the case of the transition from an L level to an H level at the emitter of the emitter follower transistor 1, the current flows through the resistor 2 from the emitter of the emitter follower transistor 1 in a direction 15 of the output 3. This current is furnished by the emitter follower transistor 1, which additionally also receives the current through the current source 20. In order to provide the transition from an H level to an L level, the current flows through the resistor 2 in a reverse direction 16, from the output 3 to the emitter of the emitter follower transistor 1. Together with a slight current through the emitter follower transistor 1, this current flows through the current source 20 to the supply potential $V_{EE}$. The current through the current source 20 flows continuously, including in the state of repose of the switching stage and regardless of the direction of the level transition. The power loss is therefore high.

Figure 1:
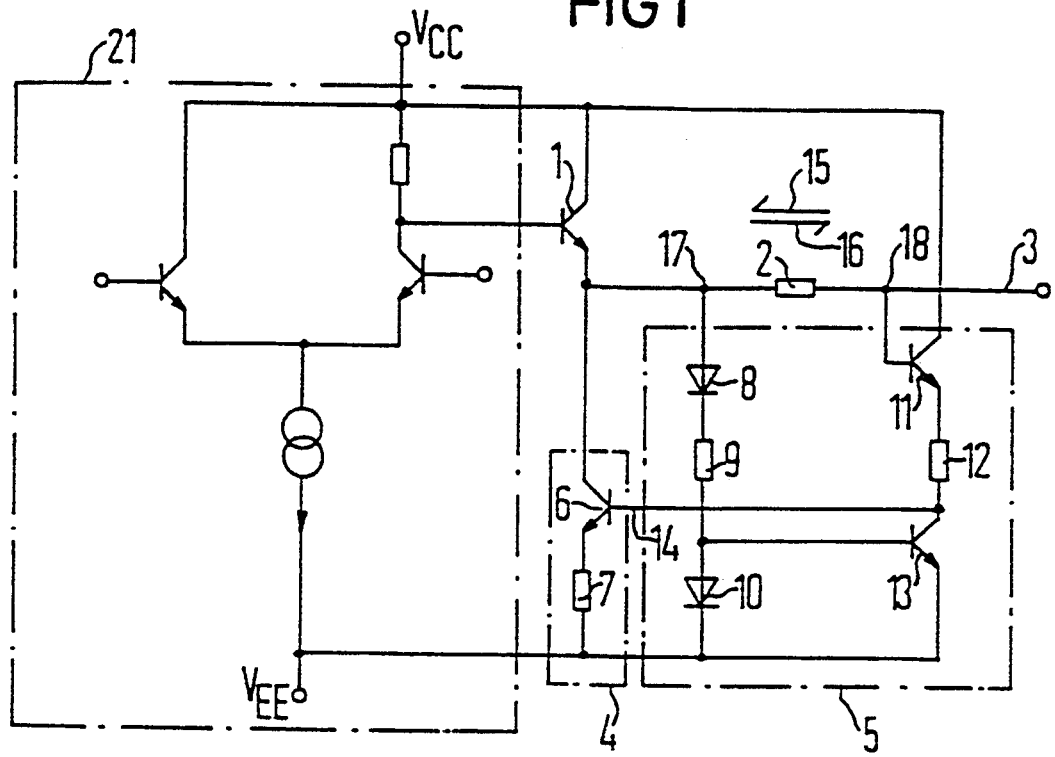
FIG. 1 is a schematic circuit diagram of a switching stage according to the invention.

FIG. 1 shows an embodiment of a switching stage according to the invention. The emitter of the emitter follower transistor 1 is connected through a controlled current source 4 to the terminal for the supply potential $V_{EE}$. The terminal connected to the emitter follower transistor 1 and an output-side second terminal 18 of the first resistor 2, are connected to a circuit 5. The polarity of the voltage dropping at the first resistor 2, and therefore the direction 15 or 16 of the current flow, are determined by the circuit 5. One output 14 of the circuit 5 is connected to the base of a bipolar transistor 6 and controls the current of the current source 4. A high level is present at the output 14 when the current flows through the first resistor 2 in the direction 15. A high current is impressed by the current source 4, so that the current through the first resistor 2 flows through the current source 4 to the supply potential $V_{EE}$. In the case of a current in the direction 16, the level at the output 14 is low. As a result, the current source 4 impresses a low current. The emitter follower transistor 1 furnishes the current that flows through the first resistor 2 in the direction 16 of the output 3. The advantage of the switching stage is that the current source 4 furnishes a high impressed current only whenever the current through the first resistor 2 flows in the direction 15. This reduces the power loss. The circuit 5 provides means for supplying a signal at the signal output 14 being dependent on the polarity of a voltage dropping at the first resistor 2.

The circuit 5 has a first current path, which includes a series circuit of a first diode 8, a second resistor 9, and a second diode 10. The anode of the diode 8 is connected to a first terminal 17 of the first resistor 2. The cathode of the diode 10 is connected to the terminal for the supply potential $V_{EE}$. The second resistor 9 is disposed between the diodes 8, 10. A second current path includes a series circuit of the base-to-emitter path of a first bipolar transistor 11, a third resistor 12, and the collector-to-emitter path of a third bipolar transistor 13. The base of the bipolar transistor 11 is connected to the output-side terminal 18 of the first resistor 2. The emitter of the bipolar transistor 13 is connected to the terminal for the supply potential $V_{EE}$. The third resistor 12 is connected between the emitter of the bipolar transistor 11 and the collector of the bipolar transistor 13. The base of the bipolar transistor 13 is connected to the anode of the diode 10, so that a current mirror circuit is formed by the diode 10 and the bipolar transistor 13. The collector of the bipolar transistor 13 serves as the output 14 of the circuit 5. The collector of the bipolar transistor 11 is selectively connected to the input-side terminal of the first resistor 2 or the collector of the emitter follower transistor 1.

In the event that the current is flowing through the first resistor 2 from the output 3 in the direction 15 of the emitter follower transistor 1, the output-side terminal 18 of the first resistor 2 is at a higher potential than its other terminal 17. As a result, the potential at the collector of the bipolar transistor 13 and therefore the potential at the base of the current source transistor 6 are raised. Otherwise the potential of the collector of the bipolar transistor 13 is low, so that the current source transistor 6 is virtually blocked. The current path including the diode 8, the second resistor 9 and the diode 10 is dimensioned in such a way that only a slight current flows. As a result, the transistor 13, which is connected as a constant current source, is made conducting and at the base-to-emitter path of the emitter follower transistor 1, in the presence of an L level, effects a bias voltage in such a way that parasitic capacitors are not completely inversely charged.

I claim:

1. A switching stage, comprising:
    a first terminal receiving a first supply potential;
    a second terminal receiving a second supply potential;
    a differential amplifier configuration having two inputs and an output, said differential amplifier configuration being connected to said first and second terminals;
    an emitter follower transistor having a base connected to said output of said differential amplifier configuration, having an emitter and having a collector;
    a controllable current source connected between the emitter of said emitter follower transistor and said first terminal for the first supply potential, said current source having a control input;
    a switching stage output;
    a resistor having a first terminal connected to the emitter of said emitter follower transistor and a second terminal connected to said switching stage output;
    means having a signal output and being connected to the first and second terminals of said resistor and to said terminal for the first supply potential, for supplying a signal at the signal output being dependent on the polarity of a voltage dropping at said resistor;
    the control input of said current source being connected to the signal output of said signal supplying means for controlling said current source to cause a high current to flow when the first terminal of said resistor is at a more negative potential than the second terminal of said resistor and to cause a low current to flow when the first terminal of said resistor is at a more positive potential than the second terminal of said resistor.

2. The switching stage according to claim 1, wherein said controllable current source includes a resistor and a bipolar transistor having an emitter, a collector and a base, the collector of said bipolar transistor is connected to the emitter of said emitter follower transistor, the emitter of said bipolar transistor is connected through said resistor to said terminal for the first supply potential and the base of said bipolar transistor forms the control input of said current source.

3. The switching stage according to claim 1, wherein:
    said resistor is a first resistor;
    said signal supplying means have first and second bipolar transistors with emitters, collectors and bases, first and second diodes with anodes and cathodes, and second and third resistors;
    the anode of said first diode is connected to the first terminal of said first resistor, and the cathode of said second diode is connected to said terminal for the first supply potential;
    said second resistor is connected between the cathode of said first diode and the anode of said second diode; the base of said first bipolar transistor is connected to the second terminal of said first resistor, and the emitter of said second bipolar transistor is connected to said terminal for the first supply potential;
    said third resistor is connected between the emitter of said first bipolar transistor and the collector of said second bipolar transistor;

4. The switching stage according to claim 3, wherein said emitter follower transistor has a collector-to-emitter path being connected between the collector of said first bipolar transistor and the first terminal of said first resistor.

* * * * *